(12) United States Patent
Chen et al.

(10) Patent No.: US 9,928,139 B2
(45) Date of Patent: *Mar. 27, 2018

(54) SYSTEMS AND METHODS FOR LAST WRITTEN PAGE HANDLING IN A MEMORY DEVICE

(71) Applicant: SEAGATE TECHNOLOGY LLC, Cupertino, CA (US)

(72) Inventors: Zhengang Chen, San Jose, CA (US); Yu Cai, San Jose, CA (US); Erich F. Haratsch, San Jose, CA (US); Zhimin Dong, Shanghai (CN)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/195,900

(22) Filed: Jun. 28, 2016

(65) Prior Publication Data

US 2016/0378598 A1    Dec. 29, 2016

Related U.S. Application Data

(63) Continuation of application No. 14/192,831, filed on Feb. 27, 2014, now Pat. No. 9,378,810.

(60) Provisional application No. 61/938,241, filed on Feb. 11, 2014.

(51) Int. Cl.
| | | |
|---|---|---|
| G11C 29/00 | (2006.01) |
| G06F 11/10 | (2006.01) |
| G11C 11/56 | (2006.01) |
| G11C 16/28 | (2006.01) |
| G11C 29/52 | (2006.01) |
| H03M 13/37 | (2006.01) |

(52) U.S. Cl.
CPC ...... *G06F 11/1068* (2013.01); *G06F 11/1012* (2013.01); *G11C 11/5642* (2013.01); *G11C 16/28* (2013.01); *G11C 29/52* (2013.01); *H03M 13/37* (2013.01); *G11C 2211/5634* (2013.01); *G11C 2211/5641* (2013.01)

(58) Field of Classification Search
None
See application file for complete search history.

(56) References Cited

U.S. PATENT DOCUMENTS

| | | |
|---|---|---|
| 5,469,546 A | 11/1995 | Hosoya |
| 5,892,896 A | 4/1999 | Shingo |
| 5,936,971 A | 8/1999 | Harari et al. |
| 6,516,425 B1 | 2/2003 | Belhadj et al. |
| 6,651,032 B2 | 11/2003 | Peterson et al. |
| 6,721,120 B2 | 4/2004 | Min et al. |

(Continued)

FOREIGN PATENT DOCUMENTS

KR    1020090013394    2/2009

*Primary Examiner* — Daniel McMahon
(74) *Attorney, Agent, or Firm* — Holland & Hart LLP

(57) ABSTRACT

Systems and method relating generally to solid state memory, and more particularly to systems and methods for recovering data from a solid state memory. In one embodiment, the systems and methods include providing a flash memory circuit including a superset of memory cells, accessing a data set from a group of memory cells using a standard reference value to distinguish bit values in the group of memory cells, and based at least in part on determining that the group of memory cells was a last written group of memory cells, re-accessing a data set from the group of memory cells using a last written reference value to distinguish bit values in the group of memory cells.

20 Claims, 4 Drawing Sheets

(56) References Cited

U.S. PATENT DOCUMENTS

| | | |
|---|---|---|
| 7,127,549 B2 | 10/2006 | Sinclair |
| 7,254,692 B1 | 8/2007 | Teoh et al. |
| 7,310,699 B2 | 12/2007 | Sinclair |
| 7,523,013 B2 | 4/2009 | Gorobets et al. |
| 7,596,656 B2 | 9/2009 | Elhamias |
| 7,721,146 B2 | 5/2010 | Polisetti et al. |
| 7,778,077 B2 | 8/2010 | Gorobets et al. |
| 8,010,738 B1 | 8/2011 | Chilton et al. |
| 8,151,137 B2 | 4/2012 | McKean et al. |
| 8,174,912 B2 | 5/2012 | Warren |
| 8,176,367 B2 | 5/2012 | Dreifus et al. |
| 8,289,768 B2 | 10/2012 | Warren et al. |
| 8,381,077 B2 | 2/2013 | Warren |
| 8,458,416 B2 | 6/2013 | Warren et al. |
| 8,499,220 B2 | 7/2013 | Warren |
| 8,560,765 B2 | 10/2013 | Warren |
| 9,013,434 B2 | 4/2015 | Hu et al. |
| 9,135,112 B2 | 9/2015 | Chen et al. |
| 9,164,828 B2 | 10/2015 | Xia et al. |
| 9,201,729 B2 | 12/2015 | Wu et al. |
| 9,235,469 B2 | 1/2016 | Zhang et al. |
| 9,276,609 B2 | 3/2016 | Chen et al. |
| 2002/0091965 A1 | 7/2002 | Moshayedi |
| 2005/0044459 A1 | 2/2005 | Scheuerlein et al. |
| 2005/0172067 A1 | 8/2005 | Sinclair |
| 2005/0204187 A1 | 9/2005 | Lee et al. |
| 2005/0209804 A1 | 9/2005 | Basso et al. |
| 2006/0245248 A1 | 11/2006 | Hu |
| 2007/0028040 A1 | 2/2007 | Sinclair |
| 2007/0266200 A1 | 11/2007 | Gorobets et al. |
| 2008/0010557 A1 | 1/2008 | Kume |
| 2008/0046779 A1 | 2/2008 | Merchant et al. |
| 2008/0086275 A1 | 4/2008 | Astigarraga et al. |
| 2008/0162079 A1 | 7/2008 | Astigarraga et al. |
| 2008/0307270 A1 | 12/2008 | Li |
| 2009/0063895 A1 | 3/2009 | Smith |
| 2009/0067303 A1 | 3/2009 | Poo et al. |
| 2009/0147698 A1 | 6/2009 | Potvin |
| 2009/0172280 A1 | 7/2009 | Trika et al. |
| 2009/0204853 A1 | 8/2009 | Diggs et al. |
| 2009/0282301 A1 | 11/2009 | Flynn et al. |
| 2010/0121609 A1 | 5/2010 | Gorinevsky |
| 2010/0122148 A1 | 5/2010 | Flynn et al. |
| 2010/0306577 A1 | 12/2010 | Dreifus et al. |
| 2010/0306580 A1 | 12/2010 | McKean et al. |
| 2011/0058415 A1 | 3/2011 | Warren |
| 2011/0060862 A1 | 3/2011 | Warren |
| 2011/0060865 A1 | 3/2011 | Warren et al. |
| 2012/0102261 A1 | 4/2012 | Burger et al. |
| 2012/0110376 A1 | 5/2012 | Dreifus et al. |
| 2012/0198312 A1 | 8/2012 | Kankani et al. |
| 2012/0215964 A1 | 8/2012 | Kaneko et al. |
| 2014/0258587 A1 | 9/2014 | Baryudin et al. |
| 2015/0113205 A1 | 4/2015 | Cai et al. |
| 2015/0117097 A1 | 4/2015 | Cai et al. |
| 2015/0220388 A1 | 6/2015 | Wu et al. |
| 2015/0227314 A1 | 8/2015 | Chen et al. |

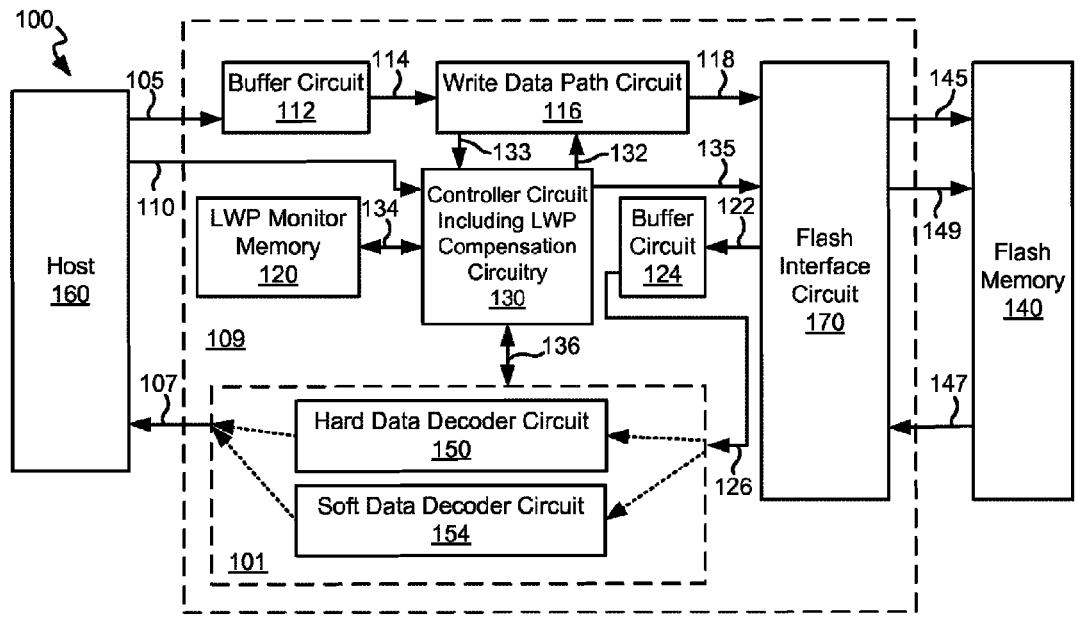
Fig. 1
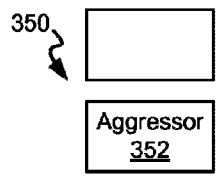
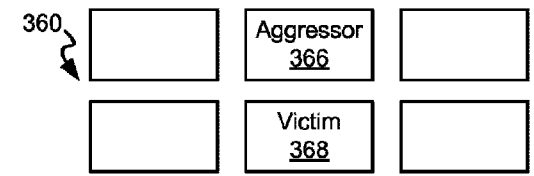
Fig. 3b                Fig. 3c
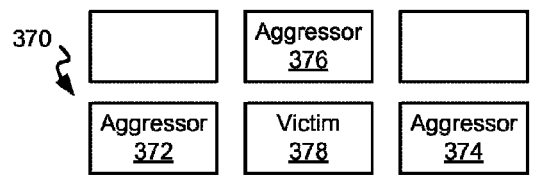
Fig. 3d
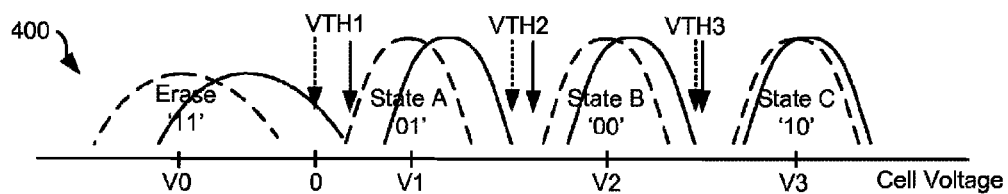
Fig. 4

SYSTEMS AND METHODS FOR LAST WRITTEN PAGE HANDLING IN A MEMORY DEVICE

CROSS REFERENCE TO RELATED APPLICATIONS

This application is a Continuation application of U.S. patent application Ser. No. 14/192,831, filed on 27 Feb. 2014 and entitled SYSTEMS AND METHODS FOR LAST WRITTEN PAGE HANDLING IN A MEMORY DEVICE, now U.S. Pat. No. 9,378,810, issued 28 Jun. 2016, which claims the benefit of the filing date of U.S. Provisional Application No. 61/938,241, filed 11 Feb. 2014, and entitled SYSTEMS AND METHODS FOR LAST WRITTEN PAGE HANDLING IN A MEMORY DEVICE, the disclosures of which are incorporated, in their entireties, by this reference.

FIELD OF THE INVENTION

Systems and method relating generally to solid state memory, and more particularly to systems and methods for recovering data from a solid state memory.

BACKGROUND

As solid state memory devices are written to store data, interference from the cell that is being written can affect the charge on a cell already written. Such interference may make recovering data from the device difficult or impossible.

Hence, for at least the aforementioned reasons, there exists a need in the art for advanced systems and methods for enhancing the ability to recover data from a solid state storage device.

SUMMARY

Systems and method relating generally to solid state memory, and more particularly to systems and methods for recovering data from a solid state memory.

Various embodiments of the present invention provide data read systems. Such systems include a memory read circuit and a controller circuit. The memory read circuit is operable to access a data set from a group of memory cells using a standard reference value to distinguish bit values in the group of memory cells. The controller circuit is operable to determine that the group of memory cells was a last written group of memory cells; and based at least in part on determining that the group of memory cells was a last written group of memory cells, to cause the memory read circuit to re-access a data set from the group of memory cells using a last written reference value to distinguish bit values in the group of memory cells.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1 shows a solid state storage system including a last written page memory and a controller circuit including last written page compensation circuitry in accordance with various embodiments of the present invention;

FIG. 3b shows inter-cell interference for an even cell (i.e., a first half written cell) in a half bit-line or even-odd bit-line architecture;

FIG. 3c shows inter-cell interference for an odd cell (i.e., a second half written cell) in a half bit-line or even-odd bit-line architecture;

FIG. 3d shows inter-cell interference for an all bit-line or even-odd bit-line architecture;

FIG. 4 graphically depicts voltage distribution and mid-state thresholds for a two bit memory device for both previously written pages and last written pages;

DETAILED DESCRIPTION OF SOME EMBODIMENTS

Figure 2:
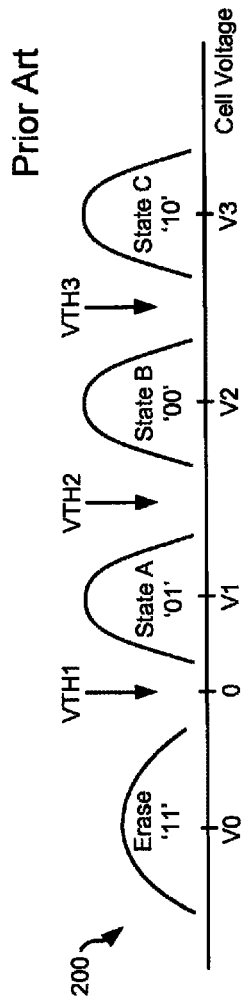
FIG. 2 graphically depicts voltage distribution and standard read thresholds for a two bit memory device.

Systems and method relating generally to solid state memory, and more particularly to systems and methods for recovering data from a solid state memory.

It has been determined that when a block of a solid state memory is partially programmed, the last written page in the block exhibits a different voltage threshold (Vt) distribution than other previously written pages in the block. Because of this, bit values read from the last written page have been found to have a higher probability of errors when using the same read reference voltages used for other pages in the block. This difference may be because the reference voltages are optimized for fully programmed blocks where almost all pages are already interfered. In contrast, the last written page is not interfered or not fully interfered because the neighboring pages are not programmed yet. Alternatively, or in addition, the difference may be because some memory devices implement interference pre-distortion techniques to mitigate inter-cell interference. In such case, the voltage threshold distribution for the last written page is distorted similar to the previously written pages, but without the counteracting inter-cell interference.

Various embodiments of the present invention provide data read systems. Such systems include a memory read circuit and a controller circuit. The memory read circuit is operable to access a data set from a group of memory cells using a standard reference value to distinguish bit values in the group of memory cells. The controller circuit is operable to determine that the group of memory cells was a last written group of memory cells; and based at least in part on determining that the group of memory cells was a last written group of memory cells, to cause the memory read circuit to re-access a data set from the group of memory cells using a last written reference value to distinguish bit values in the group of memory cells. In some cases, the system further includes a memory circuit including a superset of memory cells where the group of memory cells is a subset of the superset of memory cells. In one or more cases, each of the cells of the superset of memory cells may be a single bit memory cell, a two-bit memory cell, or a three bit memory cell. In particular cases, the superset of memory cells are flash memory cells.

In various instances of the aforementioned embodiments, the system further includes a last written group memory operable to maintain a location of the last written group of memory cells in the superset of memory cells. In some cases, the controller circuit determines that the group of memory cells was the last written group of memory cells based at least in part on a comparison of a read address with the location of the last written group of memory cells accessed from the last written group memory.

In some instances of the aforementioned embodiments, the system further includes a hard decision decoder circuit. The hard decision decoder circuit is operable to apply a hard decision decode algorithm to the data set from the group of memory cells accessed using the standard reference value to yield a first decode output, and to re-apply the hard decision decode algorithm to the data set from the group of memory cells accessed using the last written reference value to yield a second decode output. In some cases, the controller circuit determines that the group of memory cells was the last written group of memory cells based at least in part on the occurrence of one or more errors in the first decode output. In various cases, the system further includes a memory circuit including a superset of memory cells where the group of memory cells is a subset of the superset of memory cells. In such cases, the system further includes a soft decision decoder circuit operable to apply a soft decision decode algorithm to the soft read output on the group of memory cells to yield a third data decode output. The soft read output is typically generated by issuing multiple hard decision reads and incrementally applying soft decision decoding algorithm to the outputs. For example, if 2-read soft decision decoding succeeds, the controller will not apply the 3.sup.rd read. The controller circuit is further operable to: count a number of applications of the soft decision decode algorithm that have been applied to the data accessed from the group of memory cells; and based at least in part on the number of applications, triggering a background task to restore the data set from the group of memory cells in the superset of memory cells. In various cases, the background task includes a data recycle task.

In some cases, the system further includes a soft decision decoder circuit operable to apply a soft decision decode algorithm to the second decode output to yield a third data decode output. The controller circuit is further operable to: determine whether an error occurring in the first decode output is most likely not related to the data set being the last written group of memory cells; and based at least in part on determining that the error occurring in the first decode output is most likely not related to the data set being the last written group of memory cells, triggering a background task to prevent failures in other groups of memory cells in the superset of memory cells. In various cases, the background task includes a data recycle task. In other cases, the controller circuit is further operable to preclude a data write to the superset of memory cells when the controller circuit determines that the group of memory cells was a last written group of memory cells, and until the memory read circuit finishes re-accessing the data set from the group of memory cells using the last written reference value to distinguish bit values in the group of memory cells.

Other embodiments of the present invention include methods for recovering data from a memory device. The methods include: providing a flash memory circuit including a superset of memory cells; accessing a data set from a group of memory cells using a standard reference value to distinguish bit values in the group of memory cells where the group of memory cells is a subset of the superset of memory cells; and based at least in part on determining that the group of memory cells was a last written group of memory cells, re-accessing a data set from the group of memory cells using a last written reference value to distinguish bit values in the group of memory cells.

In some instances of the aforementioned embodiments, the methods further include storing a location of the last written group of memory cells of the superset of memory cells in a last written group memory. In one or more instances of the aforementioned embodiments, the controller circuit determines that the group of memory cells was the last written group of memory cells based at least in part on a comparison of a read address with the location of the last written group of memory cells accessed from the last written group memory. In various instances of the aforementioned embodiments, the methods further include: applying a hard decision decode algorithm to the data set from the group of memory cells accessed using the standard reference value to yield a first decode output; and applying the hard decision decode algorithm to the data set from the group of memory cells accessed using the last written reference value to yield a second decode output. In some cases, the controller circuit determines that the group of memory cells was the last written group of memory cells based at least in part on the occurrence of one or more errors in the first decode output. In one or more cases, the methods further include: applying a soft decision decode algorithm to the soft read output to yield a third data decode output; counting a number of applications of the soft decision decode algorithm that have been applied to the data accessed from the group of memory cells; and based at least in part on the number of applications, triggering a background task to restore the data set from the group of memory cells in the superset of memory cells.

Turning to FIG. 1, a solid state storage system 100 is shown that has a last written page memory 120 and a controller circuit 130 including last written page compensation circuitry in accordance with various embodiments of the present invention. Solid state storage system 100 includes a host 160 that makes read and write flash memory 140 requests to the SSD drive. Flash memory 140 may be NAND flash memory cells or another type of solid state memory cells as are known in the art. A flash memory controller circuit 109 (outlined by a dashed line) provides an interface between host 160 and flash memory 140.

A data write is effectuated when host 160 provides write data 105 to be written along with an LBA (logical block address) 110 indicating the location to be written. Write data 105 is stored to a buffer circuit 112 where it awaits processing by a write data path circuit 116, and LBA 110 is provided to controller circuit 130. Under the direction of controller circuit 130, write data path circuit 116 accesses the received write data from buffer circuit 112 as a block of buffered data 114. Write data path circuit 116 processes the block of data and provides the processed result as output data 118 to a flash interface circuit 170. In turn, flash interface circuit 170 provides programming commands and control 145 corresponding to output data 118 that causes a representation of write data 105 to be stored to flash memory 140. The circuitry used to implement the data write to flash memory 140 (i.e., buffer circuit 112, write data path circuit 116, and flash interface circuit 170) may be any write circuitry known in the art. This write circuitry may implement some form of inter-cell interference mitigation by pre-compensating the write thresholds included in programming level voltages and control 145 to reduce the effect of programming later written cells of flash memory cells. Where such is the case, the write thresholds for the last written page will be adjusted for inter-cell interference that has not yet occurred. The control of programming level voltages and control 145 includes a write indication location 132 that is calculated by controller circuit 130 based as least in part on LBA 110, usually translated by the controller into a physical address in the flash memory 140.

The last written page for a block of data being written is provided as a last written page location 133 from write data path circuit 116 to controller circuit 130. Controller circuit 130 stores last written page location 133 to last written page monitor memory 120 as a data 134. Each time write data path circuit 116 performs a write of a block of data the location of the last written page is updated by providing the new location of the last written page to controller circuit 130 which then updates the information maintained in last written page memory 120.

A data read is effectuated when host 160 provides LBA 110 indicating the location from which data is to be accessed. Controller circuit 135 formats a read command 135 that is provided to flash interface circuit 170. In turn, flash interface circuit 170 provides a corresponding read command 149 to flash memory 140. In response, data from a location indicated by LBA 110 is returned by flash memory 140 as input data 147. Flash memory 140 generates hard-decision read output data 147 by applying the read threshold voltages (AKA reference voltages) selected based on command 135.

As more fully described below, the read threshold values that are used for the comparison are standard threshold values in most cases, are last written page threshold values where particular conditions are met. Turning to FIG. 2, a voltage distribution 200 and standard read thresholds for a two bit memory device is shown. This two bit memory device represents respective cells of flash memory 140. It should be noted that voltage distribution 200 is merely an example, and that other distributions are possible in accordance with different embodiments of the present invention. Further, it should be noted that flash memory 140 are not limited to two bit memory cells, and that various embodiments of the present invention may utilize single bit or three or more bit memory cells. As shown, voltage distribution 400 exhibits four voltage states (ERASE, STATE A, STATE B, and STATE C) each distinguishable using a respective read voltage threshold (VTH1, VTH2, VTH3) located at approximately a midpoint between a respective voltage state. As an example, the ERASE state may represent a '11', STATE A may represent a '01', STATE B may represent a '11', and STATE C may represent a '10'. While voltage distribution 200 shows a large range between states, over time the mid-point between the lower page states may become blurred resulting in errors. Further, as discussed below in relation to FIG. 4, the last written page exhibits a translation of the respective voltage distributions due to pre-compensation for inter-cell interference that does not occur in the last written page. Where such a translation occurs, the read voltage thresholds (VTH1, VTH2, VTH3) for the standard read condition (i.e., a non-last written page) are not adequate for distinguishing between the respective voltage states (ERASE, STATE A, STATE B, and STATE C).

Figure 3A:
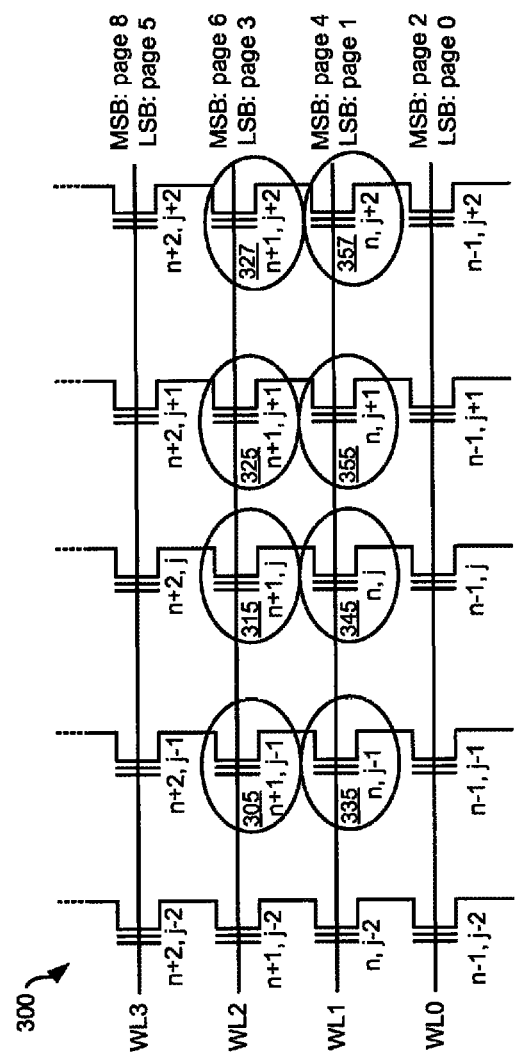
FIG. 3a shows a selection of cells from a solid state memory device showing a number of wordlines and column lines.

Turning to FIG. 3a, a selection of cells 300 from a solid state memory device including a number of wordlines (WL0, WL1, WL2, WL3) and (CL0, CL1, CL2, CL3, CL4) is shown. In this case, wordline WL1 is selected as the defined wordline and includes at least cells 335, 345, 355, 357. Wordline WL0 including at least cells is one of the direct neighbors of the defined wordline, and wordline WL2 including at least cells 305, 315, 325, 327 is the other of the direct neighbors of the defined wordline. Such cells may be programmed using a multi-step programming process. In particular, the cells are initially all written to an erase state. Subsequently, the least significant bits of each of the cells are initially programmed. Where, for example, the least significant bit of a given cell is to be programmed to be a logic '1' the voltage to which the cell is charged is below a reference voltage VTH2 from FIG. 2. In contrast, where the least significant bit of a given cell is to be programmed to be a logic '0' the voltage to which the cell is charged is above the reference voltage VTH2 from FIG. 2. This programming results in an 'X1' state corresponding to a logic '1' or an 'X0' state corresponding to a logic '0'. The programmed cells are then read back into a least significant bit storage buffer maintained in the flash memory 140 or as part of flash memory controller circuit 109.

The data to be stored as the most significant bits of the respective cells is loaded into a least significant bit storage buffer. Finally, the target threshold range for the combination of the least significant bit and the most significant bit for each of the cells is selected and used to program the respective cells. For example, where the combination of the least significant bit and the most significant bit is a '11', the voltage to which the cell is charged is below the reference voltage VTH1 from FIG. 2; where the combination of the least significant bit and the most significant bit is a '01', the voltage to which the cell is charged is below the reference voltage VTH2 from FIG. 2 and above the reference voltage VTH1 from FIG. 2; where the combination of the least significant bit and the most significant bit is a '00', the voltage to which the cell is charged is below the reference voltage VTH3 from FIG. 3 and above the reference voltage VTH2 from FIG. 2; and where the combination of the least significant bit and the most significant bit is a '10', the voltage to which the cell is charged is above the reference voltage VTH3 from FIG. 2.

Using selection of cells 300 as an example and considering cells 305, 335, 325, 355 as even page sets and cells 315, 345, 327, 347 as odd page sets. During the write process, the least significant bits of the even page sets of WL1 (cells 335, 355) are written followed by the least significant bits of the odd page sets of WL1 (cells 345, 347). Next, the most significant bits of the even page sets of WL1 (cells 335, 355) are written followed by the most significant bits of the odd page sets of WL1 (cells 345, 347). After word line WL1 is written, the next word line (WL2) is written.

Writing WL2 includes writing least significant bits of the even page sets of WL2 (cells 305, 325) are written followed by the least significant bits of the odd page sets of WL2 (cells 315, 327). Next, the most significant bits of the even page sets of WL2 (cells 305, 325) are written followed by the most significant bits of the odd page sets of WL2 (cells 315, 327). This process of writing flash memory 140 is repeated for successive lines until the last line in a block is written. In this case, where word line 3 (WL3) is not written because WL2 is the last line of the block, then the most significant bits (i.e., page 6) of WL2 is designated as the last written page, and that location is stored to last written page monitor memory 120. When word line WL2 is written it causes inter-cell interference on the previously written cells of word line WL1. This inter-cell interference is mitigated by pre-compensation in the writing of word line WL1 with an expectation of the interference from the writing of word line WL2. In contrast, as word line WL2 includes the last written page, the effects of pre-compensation of the data written to word line WL2 are not countered by the write to word line (WL3) which is not written until a later block write to flash memory 140.

Turning to FIG. 3b, a diagram 350 shows inter-cell interference for an even cell (i.e., a first half written cell) in a half bit-line or even-odd bit-line architecture. In particular, diagram 350 shows a victim cell 358 that is impacted by inter-cell interference when aggressor cells 352, 354 on the same word line are written, and when aggressor cell 356 in the subsequent word line is written. Turning to FIG. 3c, a diagram 360 shows inter-cell interference for an odd cell (i.e., a second half written cell) in a half bit-line or even-odd bit-line architecture. In particular, diagram 360 shows a victim cell 368 that is impacted by inter-cell interference only when aggressor cell 366 in the subsequent word line is written. There is no inter-cell interference from writes of cells in other cells in the same line as the odd cell is written after the even cells. These patterns of inter-cell interference correspond to the dual write approach discussed above in relation to FIG. 3a. It should be noted that embodiments of the present invention may also be applied to single phase writes (i.e., both the least significant bits and most significant bits are written for each cell together). Turning to FIG. 3d, a diagram 370 shows inter-cell interference for an all bit-line is shown. In such a situation, diagram 370 shows a victim cell 378 that is impacted by inter-cell interference when aggressor cells 372, 374 on the same word line are written, and when aggressor cell 376 in the subsequent word line is written.

Turning to FIG. 4, a voltage distribution 400 shown in dashed lines overlays voltage distribution 200 discussed above in relation to FIG. 2. Voltage distribution 400 represents the voltage distribution in the last written page where voltage distribution 200 represents the voltage distribution for previously written pages. Of note, voltage distribution 200 is affected by the actual inter-cell interference due to writing the next page, but voltage distribution 400 shows the last written page is not affected by the actual inter-cell interference due to writing the next page which is not yet written. As shown, the voltage thresholds (VTH1, VTH2, VTH3) need to be adjusted (as indicated by dashed lines) to properly interpret voltage distribution 400 compared to the same voltage thresholds (indicated by solid lines) that are used to interpret voltage distribution 200.

Returning to FIG. 1, initially, the read threshold values that are used for the comparison are standard threshold values (e.g., the threshold values VTH1, VTH2, VTH3 shown in solid lines in FIG. 4) that are used for all reads and are set to take into account any inter-cell interference compensation applied when the data was written. An error correction decoder circuit 101 pulls buffered data 126 from buffer circuit 124 and provides the pulled data to a hard data decoder circuit 150. Hard data decoder circuit 150 applies a hard decision decoding algorithm to the received data to yield a decoded output under the direction of controller circuit 130. The hard decoding algorithm may be any hard decision decoding algorithm known in the art that is capable of correcting one or more errors in a received data set. Such hard decoding may be a low density parity check decoder circuit. Based upon the disclosure provided herein, one of ordinary skill in the art will recognize a variety of hard decision decoding circuits and/or algorithms that may be used in relation to different embodiments of the present invention.

Where application of the hard decision decoding algorithm by hard decision decoder circuit 150 results in recovery of the originally written data (i.e., all errors are corrected), controller circuit 130 directs the decoded output from hard data decoder circuit 150 to be provided as read data 107 to host 160. Alternatively, when application of the hard decision decoding algorithm by hard decision decoder circuit 150 fails to recover the originally written data (i.e., fails to correct all errors), controller circuit 130 determines whether buffered data 126 includes data from a last written page. Controller circuit 130 makes this determination in accordance with the following pseudocode:

```
If (the page is upper even page AND page number is equal to the last
written page location){
        Set a Last Written Page Flag to True
    } Else If ((the page is lower even page AND page number > 0) AND
(page number is equal to the last written page location less a first device
page increment)) {
        Set the Last Written Page Flag to True
    }
    Else If ((the page is lower even page AND page number == 0) AND
(page number is equal to the last written page location less a second
device page increment)) {
        Set the Last Written Page Flag to True
    }
    Else {
        Set the Last Written Page Flag to NOT True
    }
```

The first device page increment is the difference between the page number of a lower (LSB) even page write and a subsequent upper (MSB) even page write. The second device page increment is the difference between page 0 (an even lower/LSB page) and a subsequent upper/MSB even page write. The second device page increment is a special case of first device page increment at the beginning of the block due to the programming order. It should be noted that for different architectures of flash memory 140, the algorithm for determining a last written page will change to accommodate the particular architecture.

Where buffered data 126 is not derived from a last written page, controller circuit 130 issues commands to flash memory 140 to generate soft read output, and causes a soft decision decoder circuit 154 included as part of error correction decoder circuit 101 to apply a soft decision decoding algorithm to the soft read data in buffer 124. Such soft decoding may be a low density parity check decoder circuit as are known in the art based upon soft data generated from reading flash memory 140. Any approach for generating soft data from the output of flash memory cells may be used in relation to different embodiments of the present invention.

Based upon the disclosure provided herein, one of ordinary skill in the art will recognize a variety of soft decision decoding circuits and/or algorithms that may be used in relation to different embodiments of the present invention. Where application of the soft decision decoding algorithm by soft decision decoder circuit 154 results in recovery of the originally written data (i.e., all errors are corrected), controller circuit 130 directs the decoded output from soft data decoder circuit 154 to be provided as read data 107 to host 160.

Alternatively, where application of the hard decision decoding algorithm by hard decision decoder circuit 150 fails to recover the originally written data (i.e., fails to correct all errors) and buffered data 126 was derived from a last written page, controller circuit 130 causes the data to be re-read from the flash memory 140 using last written page threshold values (e.g., the threshold values VTH1, VTH2, VTH3 shown in dashed lines in FIG. 4) to yield modified read data 122 that is stored to buffer circuit 124. In one particular embodiment of the present invention, the difference between the last written page threshold values compared with the standard thresholds is shown in the following table for each of the types of cell locations in the last written page:

| Page Type | VTH1 Difference (mV) | VTH2 Difference (mV) | VTH3 Difference (mV) |
|---|---|---|---|
| LSB Even | −150 | N/A | 0 |
| MSB Odd | N/A | −80 | N/A |
| LSB Odd | 0 | N/A | 0 |
| MSB Even | N/A | 0 | N/A |

Based upon the disclosure provided herein, one of ordinary skill in the art will recognize other offset values that may be used in relation to different embodiments of the present invention. Of course, the odd pages have smaller inter-cell interference in the examples discussed herein. However, where substantial inter-cell interference is noted, the values may be increased to address that condition. The aforementioned offsets are negative as they are applied when reading the last written page where inter-cell interference has not yet occurred. The re-read data is accessed as buffered data 126 by hard decision decoder circuit 150 based upon a command 136 from controller circuit 130. Hard decision decoder circuit 150 applies the hard decision decoding algorithm to the received data to yield an updated instance of a decoded output.

Where application of the hard decision decoding algorithm by hard decision decoder circuit 150 results in recovery of the originally written data (i.e., all errors are corrected), controller circuit 130 directs the resulting decoded output to be provided as read data 107 to host 160. When application of the hard decision decoding algorithm by hard decision decoder circuit 150 fails to recover the originally written data (i.e., fails to correct all errors), controller circuit 130 issues read commands to generate soft read output from the group of cells and causes soft decision decoder circuit 154 to apply the soft decision decoding algorithm to decoded the soft read data in buffer 124. Where application of the soft decision decoding algorithm by soft decision decoder circuit 154 results in recovery of the originally written data (i.e., all errors are corrected), controller circuit 130 provides the resulting decoded output as read data 107 to host 160. The soft read retry and decoding here starts with a first hard-decision read with the standard reference voltage values and re-decoding with the soft decision decoder. This is called 1-read soft retry. Only when 1-read soft retry fails, controller 130 issues a 2.sup.nd read command and the 2.sup.nd read output from flash memory 140 is also stored in buffer 124, forming a 2-read soft read data combined with the 1.sup.st read output in buffer 124. The 2-read soft data is again redecoded by the soft decoder. If 2-read soft retry fails, controller may enter a 3.sup.rd read retry. The soft decision retry is run in such an incremental manner until a pre-defined maximum number of reads is reached. If the soft retry succeeds in this process, the controller not only provides decoder output 107 as read data to host 160, but also records how may reads it applied to successfully decode the data.

In either case, where application of the soft decision decoding algorithm by soft decision decoder circuit 154 fails to yield the originally written data, advanced recovery processing may be applied in an attempt to recover the data. Such advanced recovery processing may include a number of retry techniques as are known in the art. Some possible recovery approaches that may be applied are discussed in U.S. patent application Ser. No. 13/804,671 entitled "Policy for Read Operations Addressing On-The-Fly Decoding Failure in a Non-Volatile Memory", and filed Mar. 14, 2013 by Chen et al. The entirety of the aforementioned application is incorporated herein by reference for all purposes.

Figure 5:
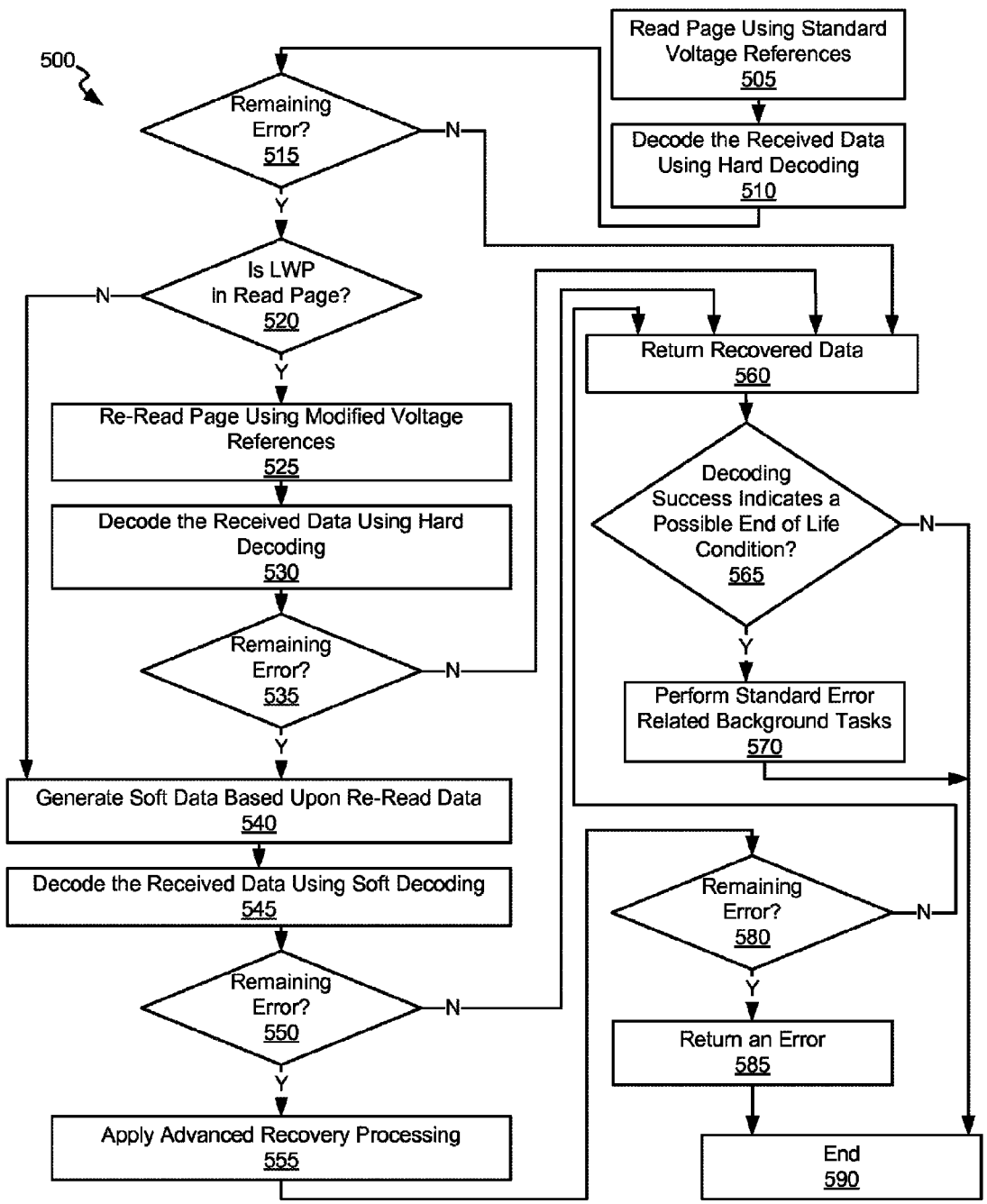
FIG. 5 is a flow diagram showing a method in accordance with some embodiments of the present invention for recovering data from a solid state memory device.

Turning to FIG. 5, a flow diagram 500 shows a method in accordance with some embodiments of the present invention for recovering data from a solid state memory device. Following flow diagram 500, a selected page is read from a flash memory device using standard read reference voltages (block 505). The standard read reference voltages are designed to distinguish between memory states of pages in the flash memory that exhibit inter-cell interference from later page writes. An example of such standard read reference voltages are shown as the solid lines of VTH1, VTH2, VTH3 in FIG. 4. The received data is then decoded by applying a hard decision decoding algorithm to yield a decoded output (block 510). The hard decoding algorithm may be any hard decision decoding algorithm known in the art that is capable of correcting one or more errors in a received data set. Such hard decoding may be a low density parity check decoder circuit. Based upon the disclosure provided herein, one of ordinary skill in the art will recognize a variety of hard decision decoding circuits and/or algorithms that may be used in relation to different embodiments of the present invention.

It is determined whether the decoded output converged (i.e., whether there are any remaining errors)(block 515). Where no errors remain (block 515), the recovered data is provided as a read data output (block 560). Otherwise, where one or more errors remain (block 515), it is determined whether the currently read page is a last written page (block 520). The determination of whether the currently read page is the last written page depends upon a last written page location maintained in memory and based upon the location of the last write performed to the flash memory device. In one particular embodiment of the present invention, the determination of the last written page is made in accordance with the following pseudocode:

---

If (the page is upper even page AND page number is equal to the last written page location){
    Set a Last Written Page Flag to True
}
Else If ((the page is lower even page AND page number > 0) AND (page number is equal to the last written page location less a first device page increment)) {
    Set the Last Written Page Flag to True
}

-continued

```
    Else If ((the page is lower even page AND page number == 0) AND
(page number is equal to the last written page location less a second
device page increment)) {
        Set the Last Written Page Flag to True
    }
    Else {
        Set the Last Written Page Flag to NOT True
    }
```

The first device page increment is the difference between the page number of a lower (LSB) even page write and a subsequent upper (MSB) even page write. The second device page increment is the difference between page 0 (an even lower/LSB page) and a subsequent upper/MSB even page write. The second device page increment is a special case of first device page increment at the beginning of the block due to the programming order. It should be noted that for different architectures of flash memory 140, the algorithm for determining a last written page will change to accommodate the particular architecture.

Where it is determined that the currently read page is the last written page (block 520), the currently read page is re-read from the flash memory device using modified voltage references (block 525). The modified voltage references are selected to compensate for the lack of inter-cell interference affecting the last written page. An example of such modified read reference voltages are shown as the dashed lines of VTH1, VTH2, VTH3 in FIG. 4. The hard decision decoding algorithm is applied to the newly read data set to yield a decoded output (block 530). It is determined whether the decoded output converged (i.e., whether there are any remaining errors)(block 535). Where no errors remain (block 535), the recovered data is provided as a read data output (block 560).

Otherwise, where one or more errors remain (block 535) or it was determined that the currently read page is not the last written page (block 520), soft data is generated for the data (block 540). Any approach known in the art for generating soft data may be used. A soft decision decoding algorithm is then applied using the soft data to yield a decoded output (block 545). The soft decoding algorithm may be, for example, a low density parity check decoder circuit as are known in the art. Based upon the disclosure provided herein, one of ordinary skill in the art will recognize a variety of soft decision decoding algorithms that may be used in relation to different embodiments of the present invention. It is then determined whether the resulting decoded output converged (i.e., whether there are any remaining errors)(block 550).

Where no errors remain (block 550), the recovered data is provided as a read data output (block 560). Otherwise, where one or more errors remain (block 550), advanced recovery techniques are applied (block 555). Such advanced recovery processing may include a number of retry techniques as are known in the art. Some possible recovery approaches that may be applied are discussed in U.S. patent application Ser. No. 13/804,671 entitled "Policy for Read Operations Addressing On-The-Fly Decoding Failure in a Non-Volatile Memory", and filed Mar. 14, 2013 by Chen et al. The entirety of the aforementioned application was previously incorporated herein by reference for all purposes. After completion of the advanced recovery techniques (block 555), it is determined whether any errors remain (block 580). Where errors remain, an error message is returned (block 585). Otherwise, where no errors remain, the recovered data is provided as a read data output (block 560).

Where the data was successfully recovered and returned as read data (block 560), it is determined whether the recovery involved one or more conditions that suggest the region of the flash device that was read is problematic and that one or more housekeeping tasks should be performed (block 565). Where a problem other than that resulting from a last page written is determined as a probable cause of an error (block 565), one or more background processes are triggered to mitigate whatever problem may have caused an error (block 570). Such background processes may include, but are not limited to data recycling processes. Determining whether an error should trigger the background processes may be done in accordance with the following pseudocode:

```
If (data recovered on first hard decision decode){
        do not trigger background processes
}
Else if (data recovered on second hard decision decode){
        do not trigger background processes
}
Else if (data recovered on the first application of soft read retry, i.e.,
1-read soft retry) {
        do not trigger background processes
}
Else {
        trigger background processes
}
```

The embodiment here prevents triggering background processes under one of the three conditions listed above. The first two conditions involves success of hard decision decoding with standard reference voltage values and the reference voltage values for last written pages, respectively. The last condition is based on number of applications of soft read retry to recover the data successfully. Where either it is determined that one or more housekeeping tasks are not to be performed (block 565), the housekeeping tasks have been completed (block 570), or an error message is returned (block 585), the process ends (block 590).

In this particular embodiment of the present invention, consideration is also made for whether the last page written may have changed between when the first application of the hard decision decoding algorithm and the second application of the hard decision decoding algorithm. This may happen due to mixed read and write operations. If it happens, both the first and the second hard decision decoding may fail, because neither one uses a good reference voltage value. In such a situation, no background tasks are started after the first application of the soft decision decoding algorithm successfully recovers the data. When a later read of the same area also requires application of the soft decision decoding algorithm background tasks will be triggered. One additional condition that may be added to address the mixed read/write problem is the disparity difference between the first application of the hard decision decoding algorithm and the first application of the soft decision decoding algorithm being greater than a threshold. This disparity is calculated in accordance with the following equation:

Disparity=[(Total Number of 1s)/(Total Number of Bits)]−0.5.

If data is written after the previous last written page (i.e., the previous last written page is no longer the last written page when the data re-read occurs), re-reading the data with the same standard voltage references used in the first application of the hard decision decoding algorithm will result in a difference in disparity because the voltage distribution has shifted. Thus, where a difference in disparity occurs it may result in an improper application of the processing which is not indicative of a need to trigger the background tasks. Thus, no background tasks are triggered where a sufficient difference in disparity is noted. In other cases, the disparity condition is not used in considering whether background tasks are triggered as the soft decision decoding algorithm is a powerful algorithm and may be able to overcome an improper adjustment to the read reference voltages due to a change in the last page written status between applications of the hard decision decoding algorithm.

Figure 6:
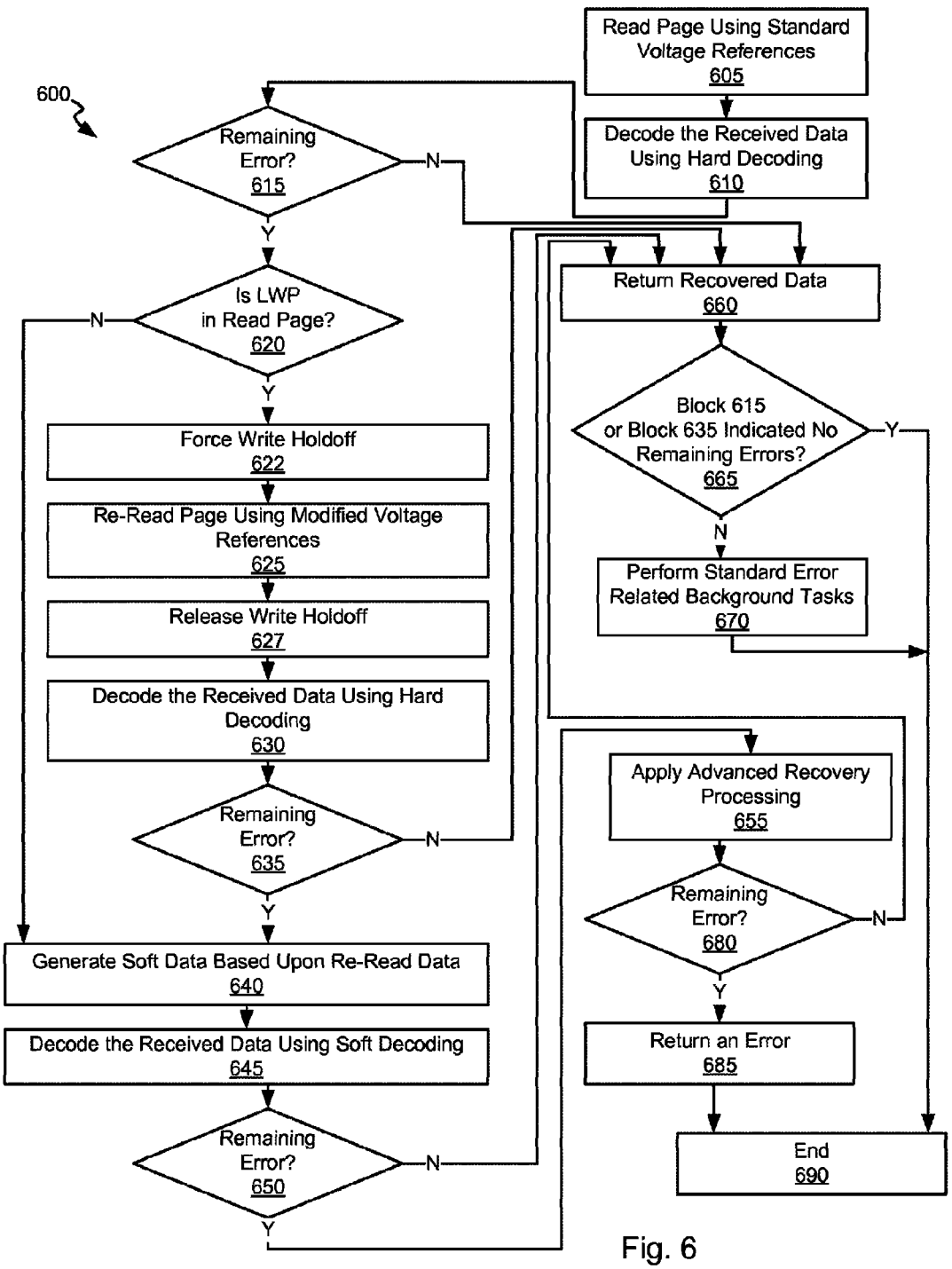
FIG. 6 is a flow diagram showing another method in accordance with other embodiments of the present invention for recovering data from a solid state memory device.

Turning to FIG. 6, a flow diagram 600 shows another method in accordance with other embodiments of the present invention for recovering data from a solid state memory device. Following flow diagram 600, a selected page is read from a flash memory device using standard read reference voltages (block 605). The standard read reference voltages are designed to distinguish between memory states of pages in the flash memory that exhibit inter-cell interference from later page writes. An example of such standard read reference voltages are shown as the solid lines of VTH1, VTH2, VTH3 in FIG. 4. The received data is then decoded by applying a hard decision decoding algorithm to yield a decoded output (block 610). The hard decoding algorithm may be any hard decision decoding algorithm known in the art that is capable of correcting one or more errors in a received data set. Such hard decoding may be a low density parity check decoder circuit. Based upon the disclosure provided herein, one of ordinary skill in the art will recognize a variety of hard decision decoding circuits and/or algorithms that may be used in relation to different embodiments of the present invention.

It is determined whether the decoded output converged (i.e., whether there are any remaining errors)(block 615). Where no errors remain (block 615), the recovered data is provided as a read data output (block 660). Otherwise, where one or more errors remain (block 615), it is determined whether the currently read page is a last written page (block 620). The determination of whether the currently read page is the last written page depends upon a last written page location maintained in memory and based upon the location of the last write performed to the flash memory device. In one particular embodiment of the present invention, the determination of the last written page is made in accordance with the following pseudocode:

---

If (the page is upper even page AND page number is equal to the last written page location){
    Set a Last Written Page Flag to True
}
Else If ((the page is lower even page AND page number > 0) AND (page number is equal to the last written page location less a first device page increment)) {
    Set the Last Written Page Flag to True
}
Else If ((the page is lower even page AND page number == 0) AND (page number is equal to the last written page location less a second device page increment)) {
    Set the Last Written Page Flag to True
}
Else {
    Set the Last Written Page Flag to NOT True
}

---

The first device page increment is the difference between the page number of a lower (LSB) even page write and a subsequent upper (MSB) even page write. The second device page increment is the difference between page 0 (an even lower/LSB page) and a subsequent upper/MSB even page write. The second device page increment is a special case of first device page increment at the beginning of the block due to the programming order. It should be noted that for different architectures of flash memory 140, the algorithm for determining a last written page will change to accommodate the particular architecture.

Where it is determined that the currently read page is the last written page (block 620), a write hold off is forced (block 622). This write hold off temporarily disallows a write to the flash memory device to assure that the last written page does not change. With the write hold off in place, the currently read page is re-read from the flash memory device using modified voltage references (block 625). The modified voltage references are selected to compensate for the lack of inter-cell interference affecting the last written page. An example of such modified read reference voltages are shown as the dashed lines of VTH1, VTH2, VTH3 in FIG. 4. Once the read is complete (block 625), the write hold-off is released (block 627) and the hard decision decoding algorithm is applied to the newly read data set to yield a decoded output (block 630). It is determined whether the decoded output converged (i.e., whether there are any remaining errors)(block 635). Where no errors remain (block 635), the recovered data is provided as a read data output (block 660).

Otherwise, where one or more errors remain (block 635) or it is determined that the currently read page is not a last written page (block 620), soft data is generated for the data (block 640). Any approach known in the art for generating soft data may be used. A soft decision decoding algorithm is then applied using the soft data to yield a decoded output (block 645). The soft decoding algorithm may be, for example, a low density parity check decoder circuit as are known in the art. Based upon the disclosure provided herein, one of ordinary skill in the art will recognize a variety of soft decision decoding algorithms that may be used in relation to different embodiments of the present invention. It is then determined whether the resulting decoded output converged (i.e., whether there are any remaining errors)(block 650).

Where no errors remain (block 650), the recovered data is provided as a read data output (block 660). Otherwise, where one or more errors remain (block 650), advanced recovery techniques are applied (block 655). Such advanced recovery processing may include a number of retry techniques as are known in the art. Some possible recovery approaches that may be applied are discussed in U.S. patent application Ser. No. 13/804,671 entitled "Policy for Read Operations Addressing On-The-Fly Decoding Failure in a Non-Volatile Memory", and filed Mar. 14, 2013 by Chen et al. The entirety of the aforementioned application was previously incorporated herein by reference for all purposes. After completion of the advanced recovery techniques (block 655), it is determined whether any errors remain (block 680). Where errors remain (block 680), an error message is returned (block 685). Otherwise, where no errors remain (block 680), the recovered data is provided as a read data output (block 660).

After recovered data is provided as a read data output (block 660), it is determined whether convergence occurred (i.e., no errors remained) in either of blocks 615, 635 (block 665). Where convergence was identified in either of blocks 615, 635 (block 665), no housekeeping tasks are triggered and the process ends (block 690). Alternatively, where convergence was not identified in either of blocks 615, 635 (block 665), one or more background processes (i.e., housekeeping processes) are triggered to mitigate whatever problem may have caused an error (block 670). Such background processes may include, but are not limited to data recycling processes. Where either it is determined that one or more housekeeping tasks are not to be performed (block 665), the housekeeping tasks have been completed (block 670), or an error message is returned (block 685), the process ends (block 690).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A system for reading data, the system comprising:
   a memory read circuit operable to access a data set from a group of memory cells;
   a controller circuit operable to:
      determine that the group of memory cells was a last written group of memory cells; and
      based at least in part on determining that the group of memory cells was the last written group of memory cells, cause the memory read circuit to re-access the data set from the group of memory cells.

2. The system of claim 1, wherein the memory read circuit accesses the data set using a standard reference value to distinguish bit values in the group of memory cells.

3. The system of claim 1, wherein the memory read circuit re-accesses the data set using a last written reference value to distinguish bit values in the group of memory cells.

4. The system of claim 1, wherein the system further comprises a memory circuit including a superset of memory cells, and wherein the group of memory cells is a subset of the superset of memory cells.

5. The system of claim 4, wherein each of the cells of the superset of memory cells are selected from a group consisting of: a single bit memory cell, a two-bit memory cell, and a three bit memory cell.

6. The system of claim 4, the system further comprising:
   a last written group memory operable to maintain a location of the last written group of memory cells in the superset of memory cells.

7. The system of claim 6, wherein the controller circuit determines that the group of memory cells was the last written group of memory cells based at least in part on a comparison of a read address with the location of the last written group of memory cells accessed from the last written group memory.

8. The system of claim 1, wherein the system further comprises:
   a hard decision decoder circuit operable to:
      apply a hard decision decode algorithm to the data set from the group of memory cells accessed using a standard reference value to yield a first decode output; and
      apply the hard decision decode algorithm to the data set from the group of memory cells accessed using a last written reference value to yield a second decode output.

9. The system of claim 8, wherein the controller circuit determines that the group of memory cells was the last written group of memory cells based at least in part on the occurrence of one or more errors in one of the first decode output or the second decode output.

10. The system of claim 1, wherein the system further comprises:
    a soft decision decoder circuit operable to apply a soft decision decode algorithm to a soft read output from the group of memory cells; and
    wherein the controller circuit is further operable to:
       count a number of applications of the soft decision decode algorithm that have been applied to the data set accessed from the group of memory cells; and
       based at least in part on the number of applications, triggering a background task to restore the data set from the group of memory cells.

11. The system of claim 10, wherein the background task includes a data recycle task.

12. The system of claim 4, wherein the controller circuit is further operable to preclude a data write to the superset of memory cells when the controller circuit determines that the group of memory cells was a last written group of memory cells, and until the memory read circuit finishes re-accessing the data set from the group of memory cells to distinguish bit values in the group of memory cells.

13. A method for recovering data from a memory device, the method comprising:
    accessing a data set from a group of memory cells using a standard reference value to distinguish bit values in the group of memory cells;
    determining that the group of memory cells was a last written group of memory cells; and
    based at least in part on determining that the group of memory cells was the last written group of memory cells, re-accessing the data set from the group of memory cells.

14. The method of claim 13, wherein the memory device includes a flash memory circuit, the flash memory circuit including a superset of memory cells, and wherein the group of memory cells is a subset of the superset of memory cells.

15. The method of claim 13, wherein re-accessing the data set from the group of memory cells includes using a last written reference value to distinguish the bit values in the group of memory cells.

16. The method of claim 13, wherein the controller circuit determines that the group of memory cells was the last written group of memory cells based at least in part on a comparison of a read address with the location of the last written group of memory cells accessed from the last written group memory.

17. The method of claim 13, wherein the method further comprises:

applying a hard decision decode algorithm to the data set from the group of memory cells accessed using a standard reference value to yield a first decode output; and applying the hard decision decode algorithm to the data set from the group of memory cells accessed using a last written reference value to yield a second decode output.

18. The method of claim 13, wherein the method further comprises:
   applying a soft decision decode algorithm to a soft read output from the group of memory cells;
   counting a number of applications of the soft decision decode algorithm that have been applied to the data set accessed from the group of memory cells; and
   based at least in part on the number of applications, triggering a background task to restore the data set from the group of memory cells.

19. A flash memory storage system, the system comprising:
   a memory read circuit operable to access a data set from a group of flash memory cells;
   a controller circuit operable to:
      determine that the group of flash memory cells was a last written group of cells; and
      based at least in part on determining that the group of flash memory cells was a last written group of cells, causing the memory read circuit to re-access the data set from the group of flash memory cells;
   a hard decision decoder circuit operable to:
      apply a hard decision decode algorithm to the data set from the group of flash memory cells; and
      apply the hard decision decode algorithm to the data set from the group of flash memory cells; and
   wherein the controller circuit determines that the group of flash memory cells was the last written group of flash memory cells based at least in part on an occurrence of one or more errors.

20. The system of claim 19, further comprising:
   a flash memory circuit including a superset of flash memory cells, wherein the group of flash memory cells is a subset of the superset of flash memory cells;
   wherein the memory read circuit accesses the data set from the group of flash memory cells using a standard reference value to distinguish bit values in the group of flash memory cells; and
   wherein the memory read circuit re-accesses the data set from the group of flash memory cells using a last written reference value to distinguish the bit values in the group of flash memory cells.

* * * * *